United States Patent [19]
Malek

[11] 3,983,498
[45] Sept. 28, 1976

[54] DIGITAL PHASE LOCK LOOP

[75] Inventor: Charles John Malek, Berwyn, Ill.

[73] Assignee: Motorola, Inc., Schaumburg, Ill.

[22] Filed: Nov. 13, 1975

[21] Appl. No.: 631,785

[52] U.S. Cl. .............................. 328/155; 328/134;
328/55; 328/72; 331/25; 329/122
[51] Int. Cl.² ......................................... H03B 3/04
[58] Field of Search .............. 328/134, 155, 72, 55;
331/25; 329/122

[56] References Cited
UNITED STATES PATENTS

| | | | |
|---|---|---|---|
| 3,209,265 | 9/1965 | Baker et al. | 328/55 X |
| 3,364,439 | 1/1968 | Cohen et al. | 331/25 X |
| 3,769,602 | 10/1973 | Griswold | 328/134 X |
| 3,789,307 | 1/1974 | Clark | 328/155 |
| 3,936,762 | 2/1976 | Cox et al. | 329/122 X |

*Primary Examiner*—John S. Heyman
*Attorney, Agent, or Firm*—James W. Gillman; Victor Myer

[57] ABSTRACT

A fast responding, low jitter, digital phase lock loop which is especially suited for synchronous, non return to zero, digitally encoded clock recovery applications.

Both leading and trailing transitions of the digital waveform triggers a monostable multivibrator which generates well defined transition pulses. These pulses are fed to a phase comparator, where they are simultaneously compared with the output of a programmable frequency divider, whose input couples to a reference frequency oscillator. The detected phase relationship between the two compared signals causes the divider to either increase, or decrease its division factor and thereby readjust the relative phase relationship between the divided signal and the digital signal until they are in phase lock.

During an absence of digital signal input, provision is made for selecting a third division factor whose value is between the first and second factors.

20 Claims, 2 Drawing Figures

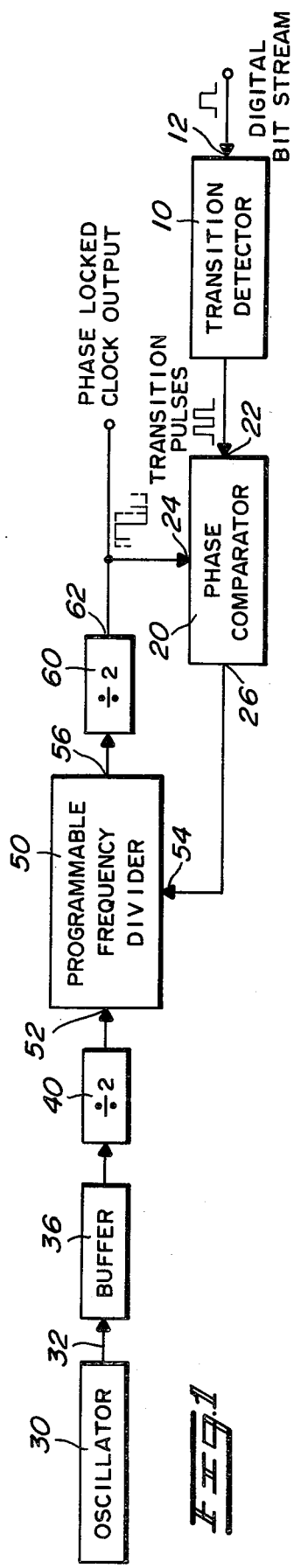
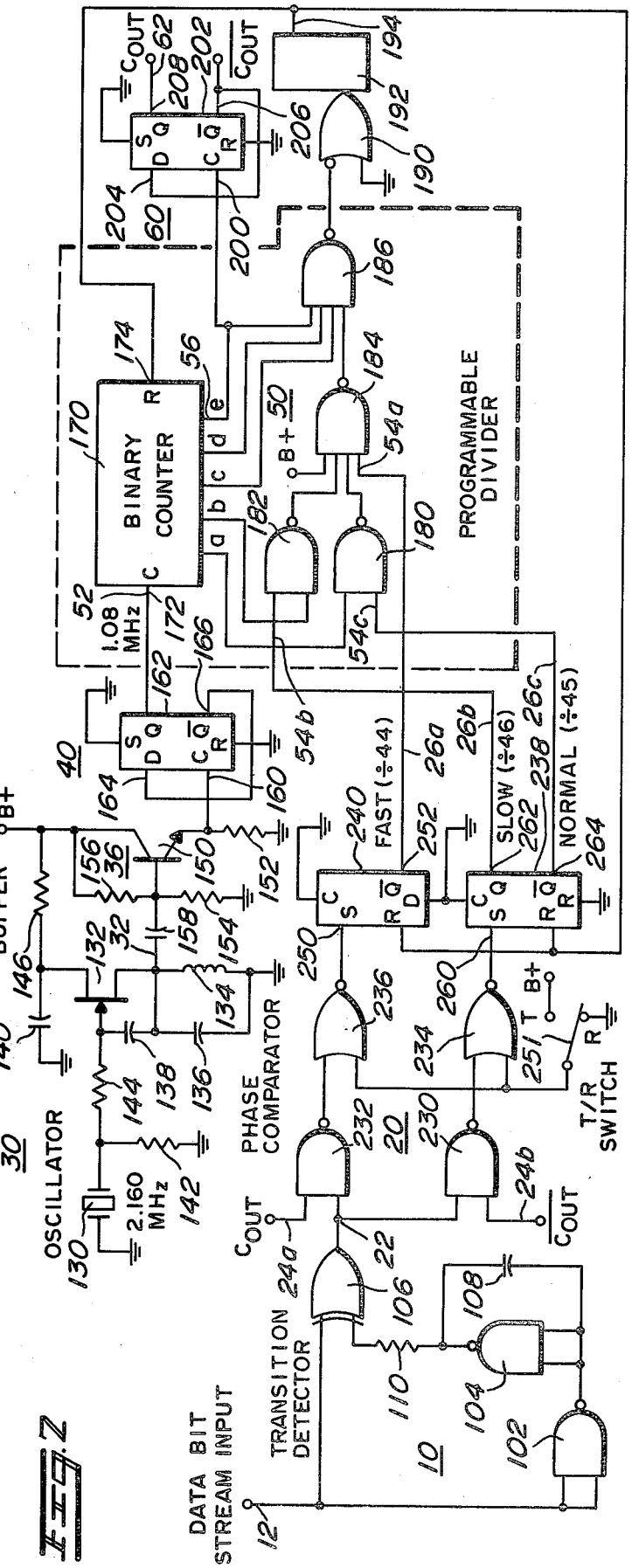

DIGITAL PHASE LOCK LOOP

BACKGROUND OF THE INVENTION

This invention relates to the digital phase lock loop art and, in particular, to an information bit stream clock recovery system which incorporates an improved digital phase lock loop.

Both analog and digital phase lock loop circuitry is well known in the art. Digital phase lock loops are particularly advantageous in communication receivers adapted to decode digitally encoded information. There, information is transmitted via a digital bit stream which is synchronous to a master clock at the transmitter. To successfully decode the bit stream, a slave clock in the receiver must lock in phase to the master clock frequency. Once in lock, the slave clock frequency is utilized for data reclocking decoding, digital to analog conversion, and code detection. Also, in transceivers, the slave clock may be used as a master clock for transmission.

The digital phase lock loops known to the prior art utilize RC voltage controlled oscillators. Such prior art circuits are unacceptable due to poor stability, excessive jitter resulting from high required lock range, long access time, idling off frequency on noise, and requiring frequent adjustment. Attempts to design around these problems have previously failed due to the high resultant system cost.

OBJECTS OF THE INVENTION

It is an object of this invention, therefore, to provide an improved digital phase lock loop.

It is a further object of the invention to provide the above improved phase lock loop which has less phase jitter and reduced lock range with improved access time.

Additionally, it is an object of the invention to provide the above described phase lock loop which has excellent stability and is relatively inexpensive to manufacture.

Further, it is an object of the invention to provide an improved digital phase lock loop as described above adapted for use in an improved digital information clock recovery system.

Basically, according to the invention, the digital phase lock loop processes the digital bit stream and generates a signal in phase lock therewith. The bit stream is passed through a transition detector, which produces defined pulses at each data stream transition. An oscillator generates a signal at a reference frequency, which reference frequency signal passes through a programmable frequency divider. Control signals to the divider select one of a plurality of frequency divisors. Both the frequency divided output of the programmable divider, and the transition pulses, are phase compared in comparator circuitry. In response to the detected phase between the two signals, the comparator produces control signals which select an appropriate frequency divisor. By changing the divisor, both the frequency and relative phase of the divided signal is altered. This process continues until the two signals are detected as being in phase lock.

BRIEF DESCRIPTION OF THE DRAWINGS

FIG. 1 illustrates the improved digital phase lock loop in block diagram form; and FIG. 2 illustrates the preferred embodiment of the digital phase lock loop when used as a clock recovery unit for digitally encoded information.

DESCRIPTION OF THE PREFERRED EMBODIMENT OF THE INVENTION

A digital bit stream containing encoded information, which is synchronous to a master clock frequency, is applied to input 12 of a transition detector 10. The transition detector 10 generates defined transition pulses which occur synchronously to each digital bit stream level transition time. In the preferred embodiment, the transition detector may be comprised of a dual edge triggered monostable multivibrator. These pulses are fed to one input 22 of a phase comparator 20.

An oscillator 30 provides reference frequency signals at its output 32 which are buffered via a buffer stage 36 and thereafter divided by two in a divider 40. The output of divider 40 is applied to the input 52 of a programmable frequency divider 50. In response to control signals at its frequency control input 54, the frequency divider 50 is operable to divide signals at its input 52 by any one of a plurality of divisors. The divided reference frequency signal appears at the divider output 56 where it is further divided by divide by two divider 60. The output 62 of divide by two divider 60 is applied to the second phase input 24 of phase comparator 20. Also, the output 62 constitutes the phase lock clock output of the phase lock system.

In operation, phase comparator 20 detects the synchronous occurrence of the transition pulses and the divided frequency output pulses. In the preferred embodiment, if the divided frequency signal is detected as being in a high state during a transition pulse, the phase comparator output 26 generates a control signal which is applied to the control input 54 of divider 50, and operates the divider to a lower divisor. The lower divisor causes the divided signal to be at a higher frequency and at a retarded phase as compared to the previous divisor. If, however, the phase detector 20 senses that the divider reference signal is at a low state during the occurrence of a transition pulse, the comparator output 26 applies an appropriate control signal to control input 54 of divider 50 to increase the divisor, thereby decreasing the divided reference signal output, and advancing its phase over the previous divisor. This is shown, in the figure, as dotted at the output 62 of divider 60. Thus, the phase comparator either advances or retards the phase of the frequency divided signal until it and the transition pulses are in phase lock. At this point, the comparator increases and decreases the divisor about a nominal value at a 50% duty cycle rate, thereby maintaining the frequency divided output in substantial phase lock with the digital bit stream.

During the absence of an input digital bit stream the phase comparator output 26 applies an appropriate control signal to input 54 whereby the divisor generates a signal at a nominal frequency, which signal may be used as the master clock for an associated transmitter.

Since the transition detector 10 has the ability to synchronize off both the leading and trailing edges of the input digital bit stream, it thus provides minimum jitter at high bit rates in a band limited, noisy environment. Also, the improved digital phase lock loop has a reduced lock range with improved access time.

While FIG. 1 illustrates a buffer stage 36, and a pair of divide by two dividers 40, 60, it will be apparent to one skilled in the art that these are not essential to a digital phase lock loop according to the instant invention but, rather, are included only to illustrate this preferred embodiment of the invention.

FIG. 2 illustrates the preferred construction of the block diagram of FIG. 1 when the digital phase lock loop is used as a clock recovery system for synchronous, digitally encoded information.

The data bit stream, which is comprised of a sequence of data bits whose transition times are synchronous to a master clock frequency at the transmitter, are fed to the transition detector 10 input terminal 12. The transition detector is comprised of two NAND gates 102, 104, an exclusive OR gate 106 and a timing circuit consisting of a capacitor 108 and a resistor 110. When interconnected as shown, these components constitute a double edge triggered monostable multivibrator which produces at its output well defined pulses synchronous to both leading and trailing level transitions of the input data bit stream, thereby reducing lock time by a factor of two, as compared with the conventional method of responding only to the leading edge. These transition pulses are fed to one input 22 of phase comparator circuitry 20. In this particular embodiment of the invention, it is known that the data bit stream input runs at approximately a 12 kHz fundamental frequency.

An oscillator circuit 30 is comprised of a crystal 130, a field effect transistor 132, timing circuitry comprised of an inductor 134 and capacitors 136, 138, together with AC bypass capacitor 140, and associated biasing and load resistors 142, 144, and 146, which bias the field effect transistor 132 between B+ and ground. The oscillator produces a 2.160 Mhz reference frequency signal which appears at oscillator output 32.

The reference frequency signal is buffered via buffer stage 36 comprised of a bipolar transistor 150, associated bias resistors 152, 154, 156 and an input coupling capacitor 158.

The output of buffer 36 is applied to the clock input 160 of a type "D" flip-flop 162 which is the heart of divide by two divider 40. The "D" input 164 of flip-flop 162 connects to a $\overline{Q}$ output 166 of the flip-flop. Thus, divide by two divider 40 frequency divides the 2.160 Mhz signal and produces a 1.08 Mhz output which is applied to the input 52 of a programmable frequency divider 50.

The programmable frequency divider 50 is comprised of a binary digital counter 170 which has a clock input 172, connected to the divider input 52, a reset input 174, and a plurality of outputs $a$–$e$ each of which is representative of a binary order of magnitude in the count of the input signal. That is, the a output line represents $2^0$, the $b$ output represents $2^1$ and so on. It should be noted, however, that in this embodiment the $d$ output represents $2^3$ and the e output represents $2^5$, the $2^4$ output not being used.

Binary counter 170 outputs $a$ and $b$ connect to a pair of NAND gates 180, 182, which in turn connect to a third AND gate 184. Binary counter outputs $c$, $d$, and $e$ connect to a fourth NAND gate 186 whose output connects to an OR gate 190 which triggers a monostable multivibrator 192. Output $e$ of binary counter 170 also connects to the clock input 200 of a type "D" flip-flop 202 which comprises output divide by two divider 60. This divider has a "D" input 204 which connects to its $\overline{Q}$ output 206 for dividing input signals at clock input 200 exactly by two, with the resultant divided signal appearing at Q output 208, which in turn, constitutes the phase lock clock output 62.

Both the Q output 208 and $\overline{Q}$ output 206 are fed back to the phase comparator second inputs 24a and 24b.

The phase comparator 20 is comprised of a pair of NAND gates 230, 232 which feed to a pair of NOR gates 234, 236, which, in turn, feed to a pair of set/reset flip-flop latches 238, 240. A transmit/receive switch 251 is operable to apply B+ voltage to the NOR gates 234, 236 when a master clock frequency is desired for an associated transmitter, or to apply ground potential thereto in the receive mode.

In operation, the transition pulses generated at the transition time of the data bit stream input are applied to the inputs of NAND gates 230, 232 along with the clock and $\overline{\text{clock}}$ outputs of divide by two divider 60. If the frequency divided output of flip-flop 60 is at a high state synchronous to the occurrence of a transition pulse, NAND gate 232 is satisfied thereby activating one input of NOR gate 236. If transmit/receive switch 251 is in the transmit mode, the output of NOR 236 does not change, whereas if it is in the receive mode, as shown, the output of NOR 236 activates a set input 250 of set/reset flip-flop 240. This, in turn, activates the $\overline{Q}$ output 252 of flip-flop 240 to its low state, which in turn applies a control signal, via phase comparator output 26a, to program control input 54a of the programmable divider 50. Programmable divider 50 nominally operates with a divisor of 45, and, with appropriate input signals, may operate wth a divisor of either 44 or 46. Output 26a activates the divider to a divisor of 44, thus increasing the frequency of the divided output, as well as retarding the phase of the output signal.

If the divided reference frequency signal output assumes a low state synchronous to the occurrence of a transition pulse, NAND gate 230 is activated, which thereby activates NOR gate 234 (assuming transmit/-receive switch is in the receive mode) thereby activating the set input 260 of set/reset flip-flop 238. In this mode, Q output 262 of set/reset flip-flop 238 is activated, thereby, via comparator output 26b, controlling the programmable divider 50 to a divisor of 46. This, in turn, decreases the reference frequency divided output, and advances its relative phase.

During an absence of an input data bit stream signal, or when transmit/receive switch 251 is in the transmit position, a $\overline{Q}$ output 164 of flip-flop 238 activates phase comparator output 26c which thereby controls the programmable divider 50 input 54c to a divide by 45 divisor.

In between transition pulses, the monostable multivibrator 192 is activated by OR gate 190 and generates a reset signal at its Q output 194 which in turn resets flip-flops 138, 140 and binary counter 170.

Thus, phase comparator 20 either advances or retards the reference frequency signal by controllably selecting a divisor of 44, or 46. Once phase lock is achieved the comparator 20 selects divisors 44, 46 at a 50% duty cycle rate, thereby minimizing jitter. Since the entire system is sensitive to each transition of the input data bit stream it has a highly sensitive, minimum jitter lock range.

In addition, when activated to the transmit mode, or during the absence of data bit stream input signals, the comparator 20 activated divider 50 to a divisor of 45, thereby providing a master clock frequency for an adjoining transmitter, or thus assuring that the divider output is stable with long DC inputs.

In summary, an improved digital phase lock loop is disclosed which provides high sensitivity with low jitter, and which is easily adapted for use in a digitally encoded information clock recovery system.

While a preferred embodiment of the invention has been described, it should be apparent that many modifications and variations thereto are possible, all of which fall within the true spirit and scope of the invention.

What is claimed is:

1. A means for processing a digital bit stream and generating a signal in phase lock therewith comprising:
   means for producing a defined pulse at each data stream transition;
   means for producing a reference frequency signal;
   means for frequency dividing said reference signal by a selected one of a plurality of divisors; and
   means for phase comparing said transition pulses with said divided reference signal and selecting a predetermined divisor in response thereto,
   whereby said frequency divided output tends to phase lock with said digital bit stream.

2. The processing means of claim 1 whererin the means for producing a defined pulse at each data transition comprises a dual edge triggered monostable multivibrator.

3. The processing means of claim 1 wherein the phase comparing means further comprises means selecting a first divisor in response to the transition pulses and the divided reference signal simultaneously assuming the same logic state, and selecting a second divisor in response to said transition pulses and said divided reference signal assuming complementary logic states.

4. The processing means of claim 1 wherein said first and second divisor means selects said first divisor at a lesser value than said second divisor.

5. The processing means of claim 4 wherein said phase comparing means further comprises means for selecting a third divisor in response to the absence of said transition pulses, said third divisor selected at a value between said first and second divisors.

6. A system for recovering a clock signal from a digital data bit stream, said bit stream containing information encoded synchronously to said clock signal, the system comprising:
   transition detector means for processing said data bit stream and producing defined transition pulses in response thereto, said transition pulses occurring synchronous to the signal level transition of said bit stream;
   oscillator means for producing a reference frequency signal;
   programmable divider means processing said reference frequency signal and producing an output signal equal to a frequency division thereof, said divider having a program input means responsive to a first program signal for programming a first frequency divisor and to a second program signal for programming a second frequency divisor; and
   comparator means for simultaneously comparing the transition pulses with the divider output signal and producing said first program signal responsive to a first predetermined relationship therebetween, and said second program signal responsive to a second predetermined relationship therebetween
   whereby the signal at the frequency divider output substantially locks in synchronism with the clock frequency.

7. The system of claim 6 wherein the transition detector is comprised of a dual edge triggered monostable multivibrator.

8. The system of claim 6 wherein the programmable divider program input means further comprises means responsive to a third program signal for programming a third frequency divisor.

9. The system of claim 8 wherein the comparator means produces said third program signal responsive to a third predetermined relationship between said transition pulses and said frequency divider output signal.

10. The system of claim 6 wherein the divider means includes means programming said first divisor to a lower value than said second divisor.

11. The system of claim 8 wherein the divider means includes means programming said first divisor to a lower value than said third divisor, and programming said second divisor at a value higher than said third divisor.

12. The system of claim 10 wherein the comparator means further comprises:
   means producing said first program signal responsive to said divider output signal assuming the same logic state as said transition pulses; and
   means producing said second program signal responsive to said divider output signal assuming the compliment logic state of said transition pulses.

13. The system of claim 12 wherein the comparator means further comprises
   latch means for maintaining said first or second program signals; said latch means having a reset input responsive to a reset signal for returning said latch to an initial condition.

14. The system of claim 13 wherein the system further comprises
   reset means responsive to the divider output signal for generating reset signals at a predetermined condition thereof.

15. The system of claim 8 further comprising means producing said third program signal in response to a decode inhibit signal.

16. The system of claim 14 wherein the programmable divider is comprised of a counter and associated logic circuitry.

17. The method of generating a signal phase locked to the clock frequency of an information bit stream, the method comprising the steps of:
   a. producing devined pulses at each bit stream level transition;
   b. generating a reference frequency signal;
   c. frequency dividing said reference frequency signal by a selected one of a plurality of divisors; and
   d. phase comparing said transition pulses with said frequency divided reference signal and selecting said frequency divisor in response thereto, whereby the frequency divided signal substantially locks in synchronism with the clock frequency.

18. The method of claim 17 wherein the step of producing transition pulses comprises the step of
   triggering a monostable multivibrator off of each bit stream transition.

19. The method of claim 17 wherein the phase comparing and divisor selecting step further comprises the steps of
   a. selecting a first divisor in response to the transition pulses and the divided reference frequency signal simultaneously assuming the same logic state; and b. selecting a second divisor in response to the transition pulses and the divided reference frequency signal simultaneously assuming complimentary logic states 20. The method of claim 19 wherein the pulse comparing and divisor selecting step further comprises the step of selecting a third divisor in response to the absence of said transition pulses, said third divisor selected at a value between said first and said second divisors.

* * * * *